July 31, 1956 E. J. SPERBER 2,756,599

TUNING CONTROL MECHANISM

Filed Jan. 4, 1954 3 Sheets-Sheet 1

INVENTOR.
Edward J. Sperber

BY H. L. Newton

ATTORNEY

INVENTOR.
Edward J. Sperber
BY H. L. Olleston
ATTORNEY

July 31, 1956 E. J. SPERBER 2,756,599

TUNING CONTROL MECHANISM

Filed Jan. 4, 1954 3 Sheets-Sheet 3

INVENTOR.
Edward J. Sperber
BY H. L. Newton
ATTORNEY.

United States Patent Office 2,756,599

Patented July 31, 1956

2,756,599

TUNING CONTROL MECHANISM

Edward J. Sperber, Philadelphia, Pa., assignor to Radio Corporation of America, a corporation of Delaware Application January 4, 1954, Serial No. 401,976

2 Claims. (Cl. 74—10.5)

This invention relates to manual control mechanism for signal selecting apparatus, and more particularly to manual tuning control mechanisms for radio and television receivers and the like to provide coarse and vernier adjustment of the variable tuning elements thereof.

Wide range or multi-range radio signal receiving equipment is generally difficult to tune accurately to any particular signal frequency or television channel due to the large frequency range to be covered by the tuning system and the generally limited mechanical movement of the manually movable control elements thereof. A small displacement of the tuning control elements of the receiver may result in a wide frequency change of the signal selection circuits. It has, therefore, been necessary in television and high frequency tunable radio apparatus to provide relatively slow motion drive or vernier control means between a main manual operating control element and the tuning elements actuated thereby to enable precise tuning to a particular signal frequency or channel.

This problem has assumed particular importance in connection with commercial television receivers since the recent allocation of some seventy channels in the ultra-high frequency (U.-H.-F.) band from 470 megacycles (mc.) to 890 megacycles. In some commercial television receivers it has been found desirable to employ continuously tunable (U.-H.-F.) tuners, in addition to very high frequency (V.-H.-F.) tuners. It is desirable in commercial receivers to provide as few front panel control means for the tuners as possible, so that average users may easily tune them to the various desired signal channels without instruction. Because of the tuning difficulties hereinbefore mentioned, each tuner should have a main tuning control element and a vernier tuning control element.

It is accordingly a principal object of this invention to provide an improved manual tuning control system or mechanism which affords coarse and vernier control of the movable tuning elements of high frequency television tuners and the like.

A further object of this invention is to provide an improved manually operable tuning mechanism for television receivers and the like, wherein a single driving element controls the movement of the tuning element of a high frequency tuner to provide coarse and vernier tuning over a relatively wide frequency range.

In accordance with the invention a front panel control knob is mountd on one end of a rotatable drive shaft for controlling the tuning element of a high frequency tuner. The drive shaft is connected by a first drive means such as a belt drive or the like to the movable tuning element of the high frequency tuner. A second drive means is provided between the drive shaft and the tuning element by a second drive means such as a train of gears or the like. The first drive means causes the tuning shaft to move slowly relative to the rotation of the front panel control knob, whereas the tuning element is moved relatively faster when driven by the second drive means.

The driving gear or the like of the second drive means may be rotatably mounted on the rotatable drive shaft. Cooperating means are provided between the first and second drive means whereby after a predetermined rotation of the first drive means in either direction the second drive means is connected for rotation by the front panel knob. In other words the front panel knob provides a predetermined limited travel for fine tuning, and after a limit is reached the tuning element is rapidly moved to approximately the desired position. By reversing the direction of rotation of the control knob, fine tuning of the exact station may be effected.

As applied to television receivers the tuning mechanism of the present invention provides simple and convenient coarse and fine U.-H.-F. tuning control through a single knob. However, although the tuning mechanism of the invention is described in connection with its application to television receivers, it is understood that it may be generally appled to the control of the tuning element in any signal selecting apparatus.

Accordingly, another object of this invention is to provide a tuning control system which includes mechanism for rapidly moving the tuning control element of a high frequency tuner to the approximate station or channel setting and having provision for fine tuning control to slowly move the tuning control element to precisely tune in the desired station or channel.

The novel features that are considered characteristic of this invention and set forth with particularity in the appended claims. The invention itself, however, both as to its organization and method of operation, as well as additional objects and advantages thereof, will best be understood from the following description when read in connection with the accompanying drawings, in which:

Figure 1:
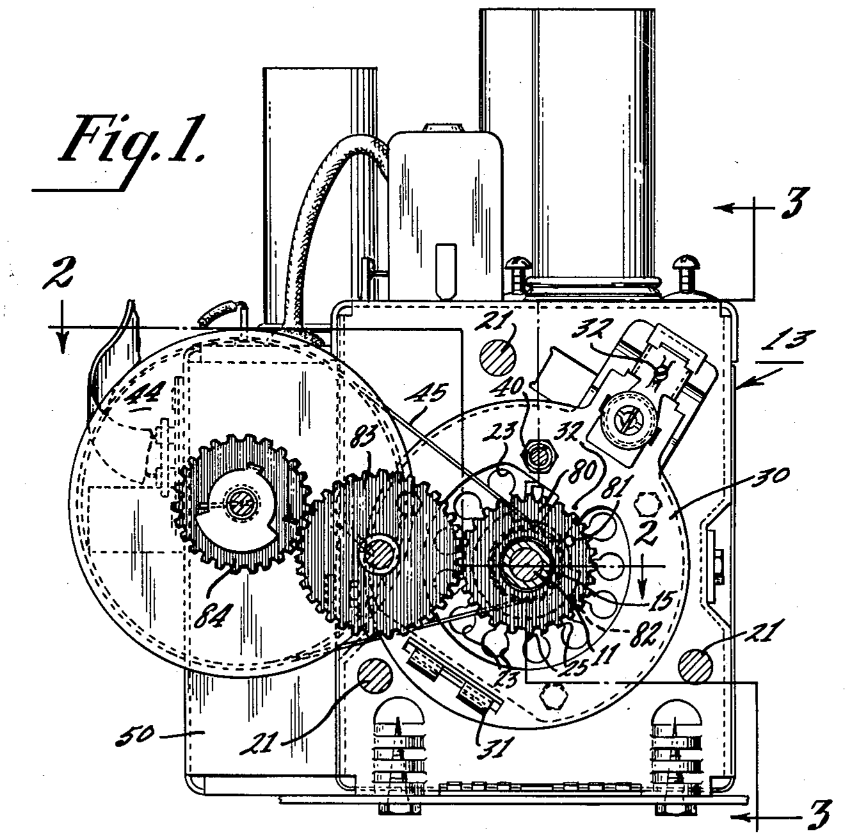
Figure 1 is a front elevational view, partly broken away, of a two unit television tuning system provided with a tuning control mechanism in accordance with the invention, having certain parts thereof emphasized by heavy black lines.

Referring now to the drawings wherein like reference characters are used to designate like components or equivalents thereof in the different figures, a control knob 10 is securely fastened for rotation with a main tuning control or drive shaft 11. The shaft 11 is fixedly coupled through a collar 24 to a rotary tuning shaft 12 for a very high frequency (V.-H.-F.) tuner 13. Naturally the tuning shaft 12 could be constructed as a single shaft, however, the two piece construction is preferably in some instances to facilitate assembly of the unit. The V.-H.-F. tuner 13 may be of any suitable type having a rotary control shaft, but is preferably of the conventional step-by-step rotary shaft type and may be assumed to be of this type by way of example.

The tuner mechanism has detent means connected with the control shaft 11 or the tuning shaft 12 for defining thirteen stop positions, through one revolution of the knob 10. Twelve of these positions may correspond to the V.-H.-F. television channels 2–13, and the thirteenth position may be selected to condition or set the tuning mechanism for ultra-high frequency operation, as will hereinafter be described.

The fine tuning control for the very high frequency tuner 13 may be provided by any conventional means such as, for example, an auxiliary small variable capacitor. One type of capacitor which may be used in the apparatus shown has a fixed cylindrical electrode with an axially movable core electrode therein. The capacitance of the fine tuning capacitor may be varied by movement of the core which in the present example is controlled by the fine or vernier control knob 14.

The knob 14 is securely fastened on one end of an axially movable and rotatable shaft 15 which is a second tuning control or drive shaft and is concentrically mounted on the main tuning control shaft 11. The other end of the shaft 15 is provided with a clutch member 16 which is of enlarged diameter with respect to the shaft and has teeth on the opposite faces thereof for transmitting rotational motion of the knob 14 to a desired cooperating clutch face depending on the axial position of the shaft 15. When the main tuning control shaft 11 is rotated to a V.-H.-F. position the shaft 15 is spring biased so that one face of the clutch member 16 is urged against a cooperative toothed clutch face of a V.-H.-F. vernier coupling shaft 17.

A collar having a cam surface 18 is provided on one end of the coupling shaft 17. A frame member or yoke 30, which is pivotally mounted on a hinge 31, has a cam follower 32 (best shown in Figure 1), which rides on the cam surface 18 to control the pivotal movement of the frame 30.

The fine tuning control capacitor core is fastened for axial movement to an end 32 of the frame or yoke 30 opposite the pivot point or hinge 31. Upon rotation of the knob 14 the frame 30 pivots on the hinge 31 causing axial movement of the tuning core to provide the necessary fine tuning. It is understood that a rotatable fine tuning control element could be used by providing simple gearing means between the coupling shaft 17 and said rotatable fine tuning control element.

A bracket plate 20 is supported in spaced relation to and parallel with the front surface of the tuner 13 housing by a set of columns 21 which are mounted directly on the V.-H.-F. tuner 13 housing. A bearing surface 22 is provided in the bracket plate 20 to provide support for the tuning control shafts 11 and 15. A plurality of access holes 23 are provided in the bracket plate 20 and the front plate of the tuner 13 and disposed in a locus concentric with the shafts 11 and 15 so that screwdriver adjustments may be made on the V.-H.-F. tuner without disassembling the entire unit.

For tuning in the U.-H.-F. range, the knob 10 is turned to the aforementioned thirteenth or U.-H.-F. position to condition the mechanism to connect the knob 14 with the tuning element of a U.-H.-F. tuner 50. This is done by moving the clutch 16 into engagement with a U.-H.-F. pulley 42.

Figure 3:
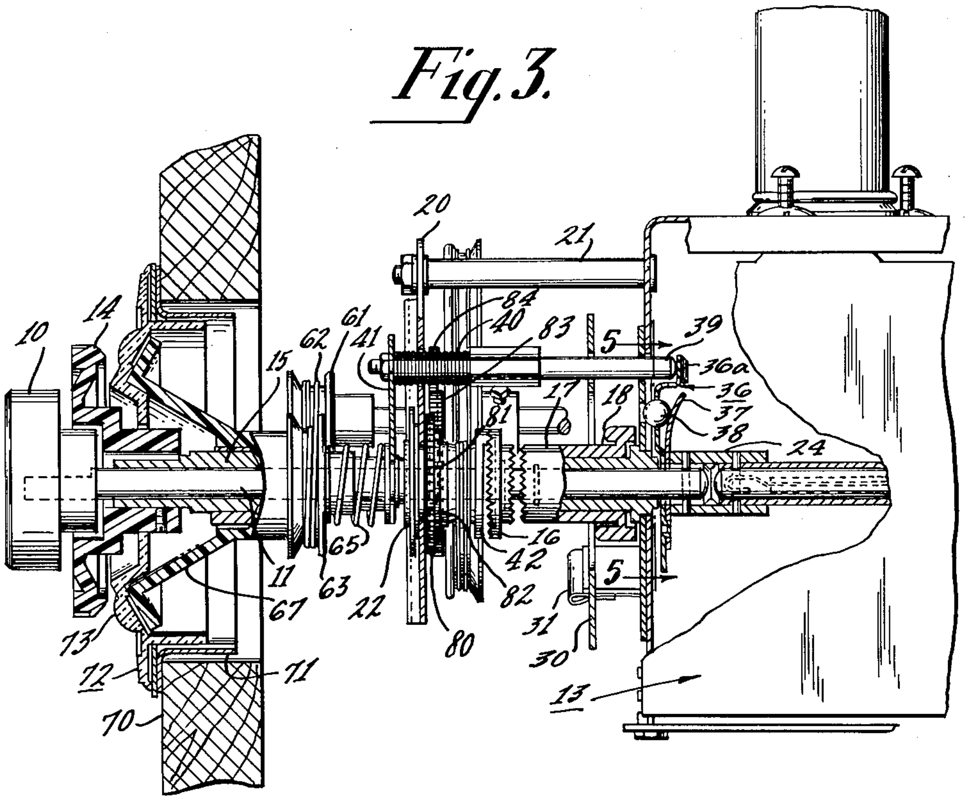
Figure 3 is a side view, partly in section, of the tuning system and mechanism of Figure 1, this section being taken on the line 3—3 of Figure 1, looking in the direction of the arrows and the mechanism being conditioned for U.-H.-F. tuning.

As shown in Figures 3, *5a* and *5b*, a cam member 36, is securely fastened for rotation with the main tuning shaft 11. When the knob 10 is turned to the U.-H.-F. position the shaft 11 and the cam member 36 are brought into a position where the cam 36 bears against one end of an axially movable spring loaded thrust rod 39. The cam 36 has a pair of wings or arms 36*a* which are bent back so that the end of the thrust rod 39 will ride up the wing, and ride out against the spring loading.

Detent means for the tuning system is provided by a ball-bearing 38 which is located in an aperture of the cam member 36 and is urged against the front plate of the tuner by a leaf spring 37. A series of rectangular cooperating apertures 25 are cut in the front surface of the V.-H.-F. tuner housing corresponding to the various V.-H.-F. channel settings and the U.-H.-F. setting. The bearing member 38 is forced into the cooperating apertures 25 to insure accurate reset alignment of the tuning shaft 12. In the U.-H.-F. position the ball-bearing 38 also insures alignment of the cam member 36 and the thrust rod 39.

The thrust rod 39 extends through the bracket plate 20 and is rigidly coupled with the axially movable shaft 15 by means of an arm 41 so that the shaft 15 will be moved into one of two positions dependent on the position of the rod 39. The thrust rod 39 is surrounded by a spring 40 which is compressed between the bracket plate 20, and a raised portion on the rod to spring bias the rod toward the tuner housing and, hence, the vernier tuning control shaft 14 toward the vernier coupling shaft 17.

Figure 2:
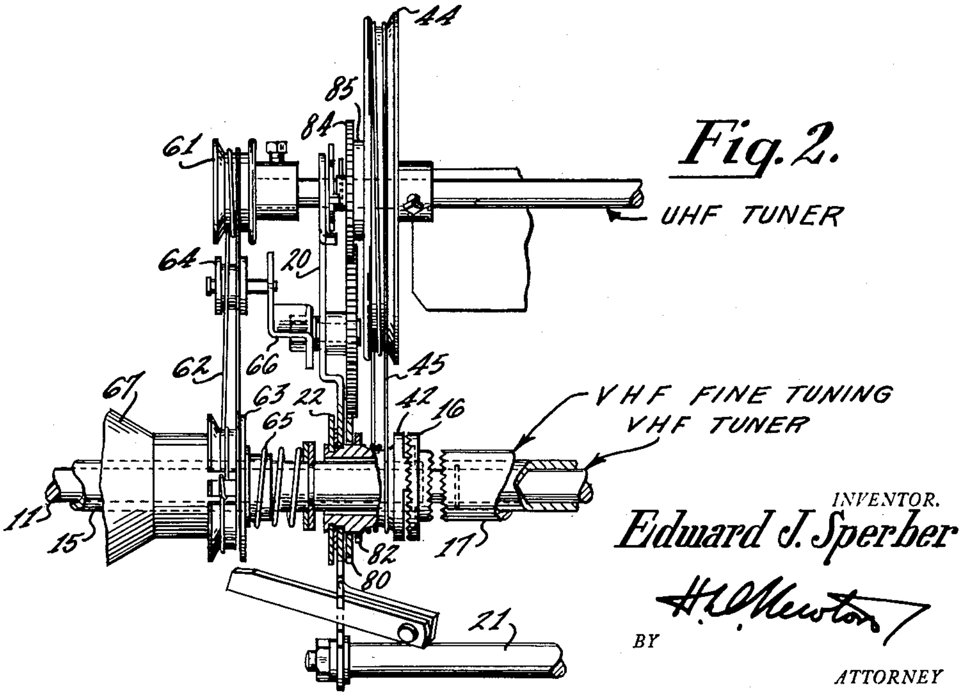
Figure 2 is a top view, partly in section of the tuning system and tuning control mechanism shown in Figure 1, the section being taken on the line 2—2 of Figure 1, and looking in the direction of the arrows.

In the ultra-high frequency position of knob 10 the clutch 16 is moved by the action of the cam 36 and the thrust rod 39 to the position shown in Figures 2 and 3 wherein one toothed face of the clutch member 16 is in driving relation with a corresponding toothed clutch face of the ultra-high frequency pulley 42. As may be best seen by reference to Figure 2, the ultra-high frequency driving pulley 42 is rotatably mounted on the shaft 15 and is coupled by means of a belt 45 to a larger pulley 44 which drives the U.-H.-F. tuner 50. Due to the relative sizes of the pulleys a relatively large rotation of the knob 14 is required to move the tuning element of the ultra-high frequency tuner 50 a relatively smaller amount, hence, enabling easier accurate tuning. The pulley 44 is mounted through a slip clutch 85 to one end of a shaft 46 which rotates in bearings provided by the bracket plate 20 and the front surface of the V.-H.-F. tuner 50 housings.

Figure 6:
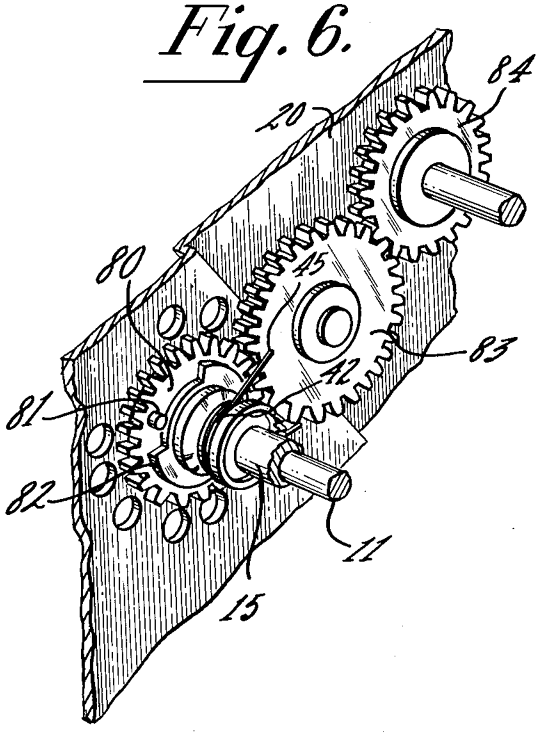
Figure 6 is an enlarged fragmentary view in perspective taken from above and behind a portion of the tuning mechanism shown in Figure 1.

As is best shown in Figure 6, a gear 80 is rotatably mounted on the U.-H.-F. pulley 42. A stud 81 on the gear 80 extends out parallel to the common axis of the gear 80 and pulley 42. A bushing 82 is provided on the pulley 42 for rotation therewith, which has a cut out portion for receiving the stud 81 of the gear 80. The dimensions of the cut out portion are not critical and in the embodiment of the invention may allow the pulley 42 about 30–50° of rotation without hitting the stud 81. An idler gear 83 which meshes with the gear 80 is rotatably mounted on the bracket plate 20 and a third gear 84 which meshes with the idler gear 83 is securely fastened for rotation with the U.-H.-F. tuning shaft 46. Preferably the gears 80, 83 and 84 should provide a low turn ratio so that one revolution of the gear 80 causes approximately 1½ revolutions of the gear 84.

A slip clutch 85, which is securely fastened to the shaft 46 supports the pulley 44, so that the shaft 46 may turn independently of the pulley 44.

The operation when the knob 10 conditions the tuning mechanism for U.-H.-F. operation, the knob 14 provides both fine and coarse U.-H.-F. tuning. A small amount of rotation of the knob 14 drives the U.-H.-F. pulley 42 as described above, so that the pulley 42 and the bushing 82 rotate within the limits established by the stud 81 which extends into the cut out of the bushing 82. This limited rotation is transmitted by the belt 45 to the pulley 44 which in turn causes the U.-H.-F. tuning shaft 46 to be rotated. Due to the relative sizes of the pulleys 42 and 44, the shaft 46 is rotated at a slow rate relative to the rotation of the control knob 14. In practice it was found that a 7.5 to 1 ratio of the control knob 14 revolutions to the tuning shaft 46 revolutions provided acceptable vernier or fine tuning.

After the pulley 42 has been rotated to the limit established by the stud 81 on the gear 80, further movement of the pulley 42 or knob 14 in the same direction causes the gear 80 to be rotated. The rotational motion of gear 80 is transmitted through the idler gear 83 to the gear 84 on the shaft 46. The ratio of drive between the pulley 42 and the U.-H.-F. tuning shaft 46 is much lower when the shaft 46 is driven by the gears 80, 83, and 84, that is, the shaft 46 rotates faster when driven by the gear train than when driven by the pulleys 42—44 for a predetermined rotation of the control knob 14. Thus the gear drive causes the shaft 46 to rotate faster than the pulley 44. The slip clutch 85 allows the shaft 46 to turn independently of the pulley 44, and thus allows faster and coarse tuning of the U.-H.-F. tuner, without damaging the pulley and belt drive means.

When the desired channel is approximately tuned in, the direction of rotation of the knob 14 may be reversed, to release the gears 80, 83 and 84 and permit fine tuning to the precise signal frequency as described above.

It is understood that the gear train or belt drives can be interchanged, or both the coarse or fine tuning drive means may be replaced by either belt drive or gear trains, or any other suitable coarse and fine tuning drives.

The ultra-high frequency tuner 50 may be of any well known type such as, for instance, one having a variable capacitor as the tuning element thereof and is preferably continuously tunable over the desired U.-H.-F. range.

An indicating dial 67 is provided for showing the U.-H.-F. channel selection of the U.-H.-F. tuner 50. The indicating dial is rotatably mounted on the shaft 15 and is biased against an escutcheon 72 by a spring 65. A pulley 63 is fastened as a part of the rear of the dial 67 and is connected by a belt 62 to a pulley 61 which is fastened for rotation with the shaft 46. A pulley 64 is provided intermediate the pulleys 61 and 63 to keep the belt member 62 taut.

The pulley 64 is rotatably mounted on a pin which is supported by a bracket arm 66. The bracket arm 66 is fastened on the bracket plate 20 by means of one of the fastening nuts on the end of the supporting rods 21, and is rotatable to provide the desired amount of tension on the belt 62.

The size of the pulleys 61 and 63 are selected so that the indicating dial 67 will be rotated through one revolution while the U.-H.-F. tuner is tuned over its entire frequency range. Thus the dial calibrations corresponding to channels 14—83 may be spread around the periphery of the dial 67 to correctly indicate the channel to which the U.-H.-F. tuner is tuned. The dial 67 will only be rotated by the rotation of the shaft 46.

Figure 4:
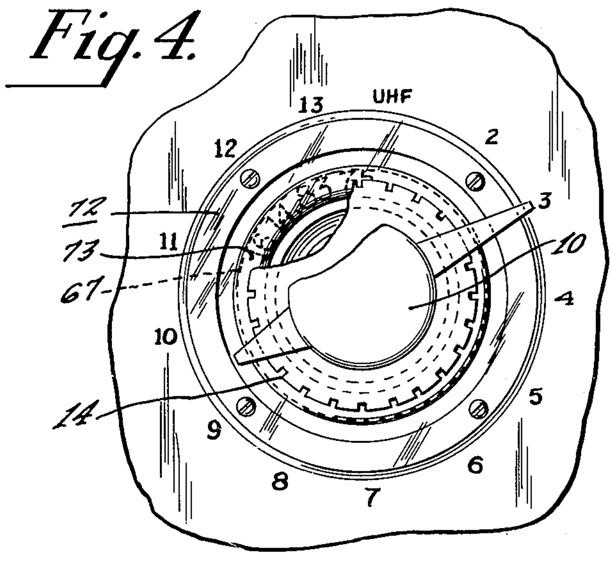
Figure 4 is a front panel view of the tuning control mechanism of Figures 1, 2 and 3, showing further features of the invention.
Figure 5:
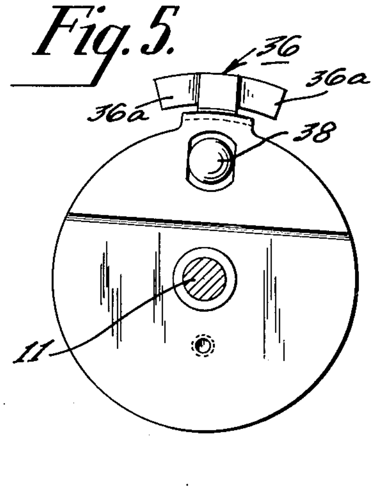
Figure 5 is a front view of certain members of the tuning control mechanism of Figures 1, 2, 3 and 4 showing constructional details thereof.

As shown in Figures 3 and 4 the tuning knobs 10 and 14 project through a suitable aperture in the receiver cabinet 70. A supporting and centering ring 71 is fitted into the aperture to provide a base member on which the escutcheon 72 may be mounted. The escutcheon 72 may be fabricated of a Lucite or other transparent material so that the dial calibrations on the ultra-high frequency indicating dial 67 may be viewed therethrough. As shown in the drawings, a convex portion 73 may be provided over the index marks on the escutcheon to magnify these calibrations on the indicator dial 67. The V.-H.-F. channel indices may be affixed in any suitable location, such as on the receiver cabinet 70 as shown.

From the foregoing description it is evident that the invention provides an improved tuning mechanism having single knob control means for effecting coarse and vernier tuning control of a high frequency tuner. The embodiment of the invention as shown and disclosed is meeting a wide demand for an effective coarse and fine tuning control that is applicable to present day commercial television receivers for home use and the like.

What is claimed is:

1. A manual tuning control mechanism for selectively actuating a pair of high frequency tuners comprising in combination, movable tuning control means for each of said tuners a movable fine tuning control means for at least one of said tuners, first and second tuning drive shafts, means for connecting the first of said drive shafts with the movable tuning control means of the tuner having the movable fine tuning control means, a clutch member mounted on said second shaft, means coupling said clutch member with the movable fine tuning control means for said one tuner, a drive mechanism for the other of said tuners, further means including said first shaft for selectively moving said second shaft to decouple said clutch member from said fine tuning control means and couple said clutch with said drive means, said drive means comprising means for selectively moving the main tuning element of the other of said tuners at a relatively fast or slow rate with respect to the movement of said second control shaft.

2. A manual tuning control mechanism for selectively actuating a pair of high frequency tuners as defined in claim 1, wherein said drive means for selectively moving said drive means a relatively fast or slow rate with respect to the movement of said second control shaft comprising a first pulley having a bushing with a cut out portion, a second pulley having a large diameter relative to said first pulley, a shaft connected with the main tuning element of said second tuner, said second pulley disposed on said shaft, clutch means interposed between said pulley and said shaft, a gear train connected with said shaft comprising a plurality of gears, one of said gears having a stud extending into the cut out portion of said bushing, whereby rotation of said second drive shaft in the limitations established in said cut out portion causes the tuning element of said second tuner to be moved at a relatively slower rate and further movement of rotation of said second tuner of said shaft to move at a relatively faster rate.

References Cited in the file of this patent

UNITED STATES PATENTS

| | | |
|---|---|---|
| 2,078,427 | Teaf | Apr. 27, 1933 |
| 2,203,736 | Mahnken | June 11, 1940 |

FOREIGN PATENTS

| | | |
|---|---|---|
| 609,651 | Great Britain | Oct. 5, 1948 |